United States Patent
Needle

(10) Patent No.: US 6,285,195 B1
(45) Date of Patent: Sep. 4, 2001

(54) TIME DOMAIN REFLECTOMETRY APPARATUS AND METHOD

(76) Inventor: David Needle, 2719 Encinal Ave., Suite C, Alameda, CA (US) 94501

( * ) Notice: Subject to any disclaimer, the term of this patent is extended or adjusted under 35 U.S.C. 154(b) by 0 days.

(21) Appl. No.: 09/039,511

(22) Filed: Mar. 16, 1998

(51) Int. Cl.⁷ .................................................. G01K 31/11
(52) U.S. Cl. ...................... 324/534; 324/158.1; 324/617
(58) Field of Search ............................... 324/534, 52, 617, 324/535, 531, 158.1

(56) References Cited

U.S. PATENT DOCUMENTS

| | | | |
|---|---|---|---|
| 4,484,131 | * 11/1984 | Jenkinson | 324/52 |
| 4,491,782 | * 1/1985 | Bellis et al. | 324/52 |
| 4,538,103 | 8/1985 | Cappon | 324/52 |
| 4,739,276 | 4/1988 | Graube | 324/534 |
| 4,766,386 | * 8/1988 | Oliver et al. | 324/533 |
| 4,914,394 | * 4/1990 | Meyer | 324/534 |
| 4,970,466 | 11/1990 | Bolles et al. | 324/533 |
| 5,162,743 | * 11/1992 | Kruchowski et al. | 324/617 |
| 5,382,910 | 1/1995 | Walsh | 324/533 |
| 5,440,528 | 8/1995 | Walsh | 368/113 |
| 5,461,318 | 10/1995 | Borchert et al. | 324/533 |
| 5,514,965 | 5/1996 | Westwood | 324/533 |
| 5,717,337 | * 2/1998 | Kelly | 324/534 |

* cited by examiner

Primary Examiner—Safet Metjahic
Assistant Examiner—Jimmy Nguyen
(74) Attorney, Agent, or Firm—Glen R. Grunewald

(57) ABSTRACT

A reference length of electrically conductive material having a predetermined electrical length and impedance permanently inserted in a time domain reflectometer measuring path prior to the connection point to the cable-under-test. Measurement to the start of the reference length is used to establish a reference position within the measurement path for subsequent time domain reflectometry measurements.

13 Claims, 12 Drawing Sheets

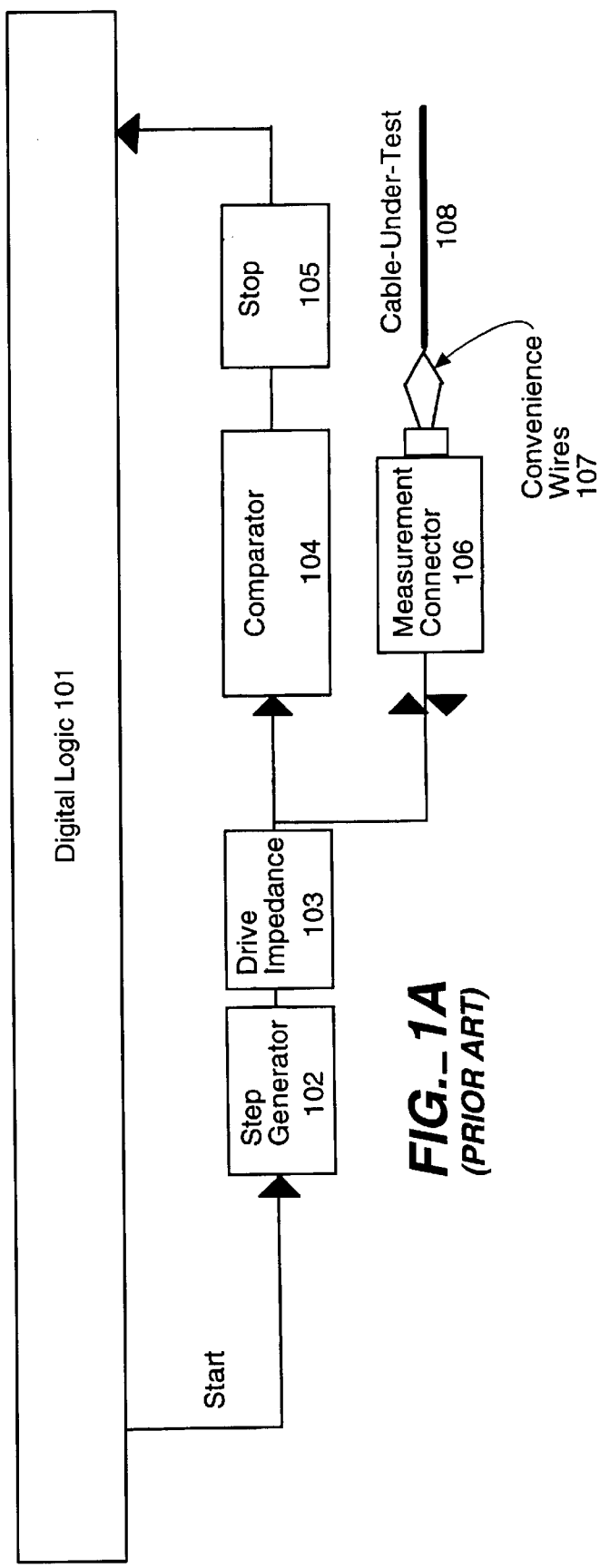
FIG._1A
(PRIOR ART)
FIG._1B
(PRIOR ART)

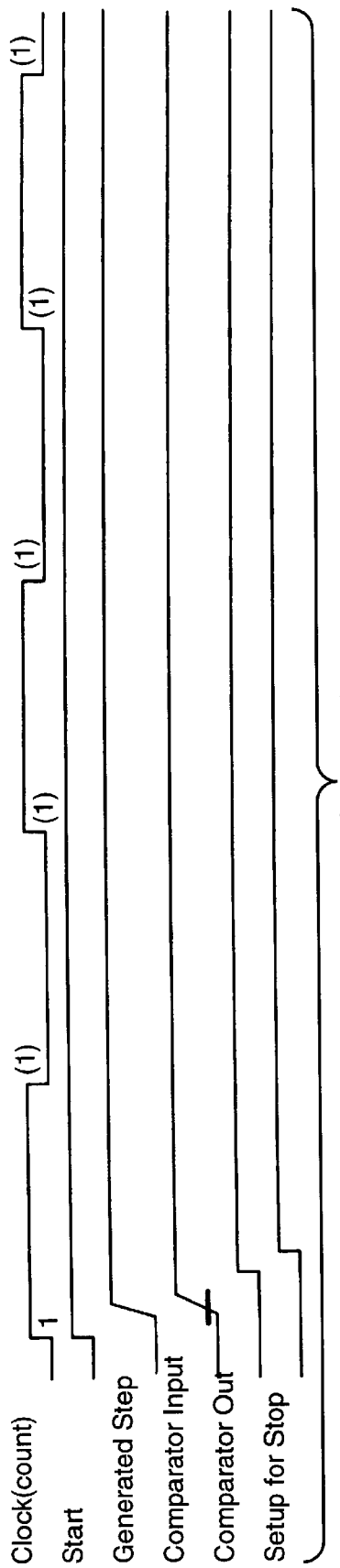
FIG._2A
*(PRIOR ART)*
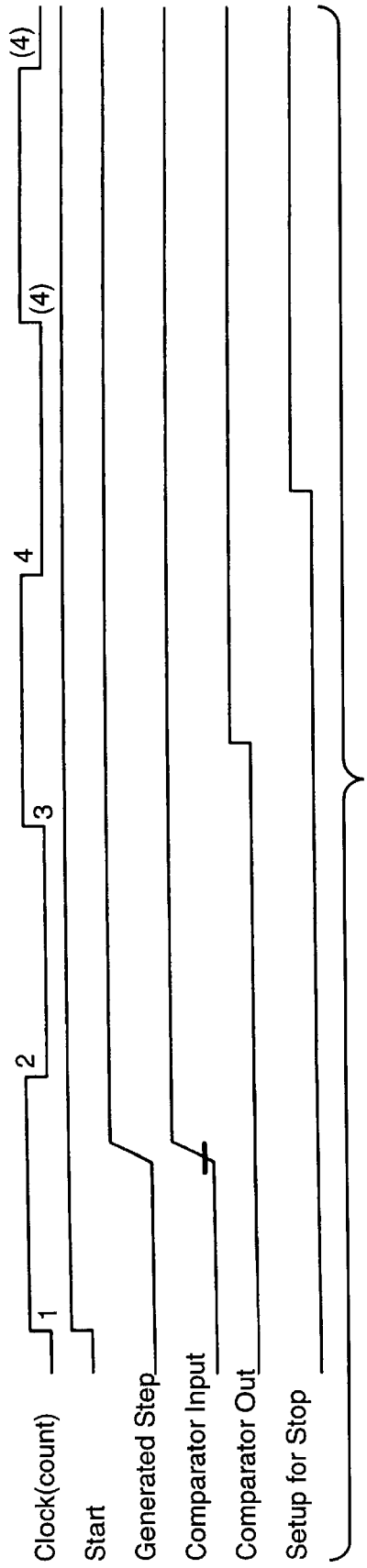
FIG._2B
*(PRIOR ART)*

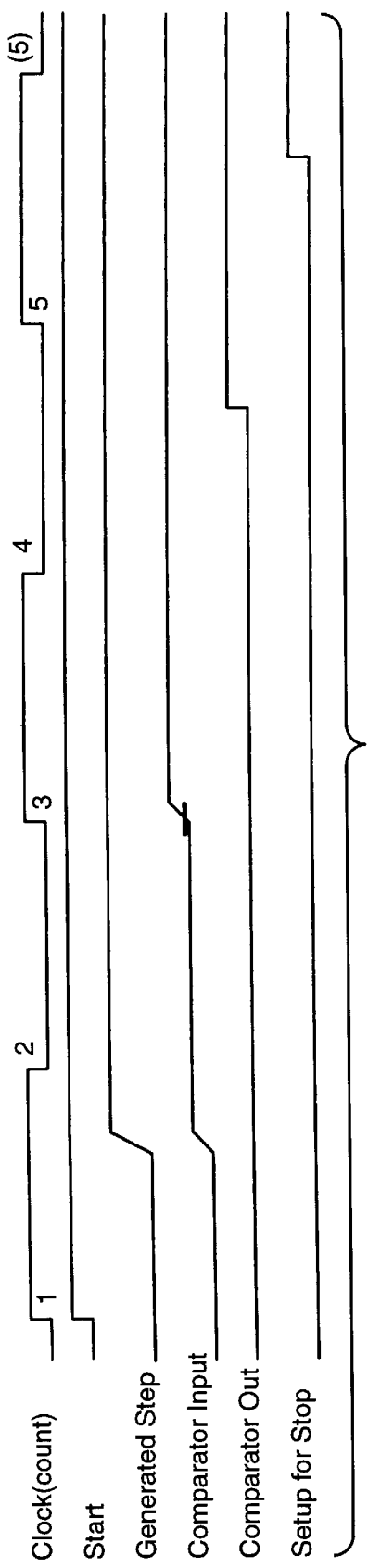
FIG._2C
*(PRIOR ART)*
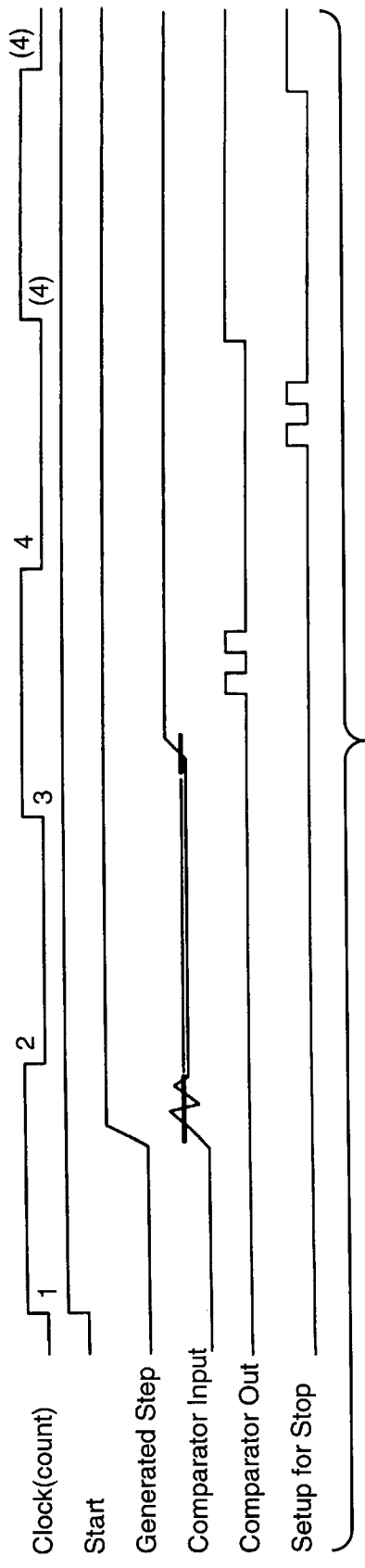
FIG._2D
*(PRIOR ART)*

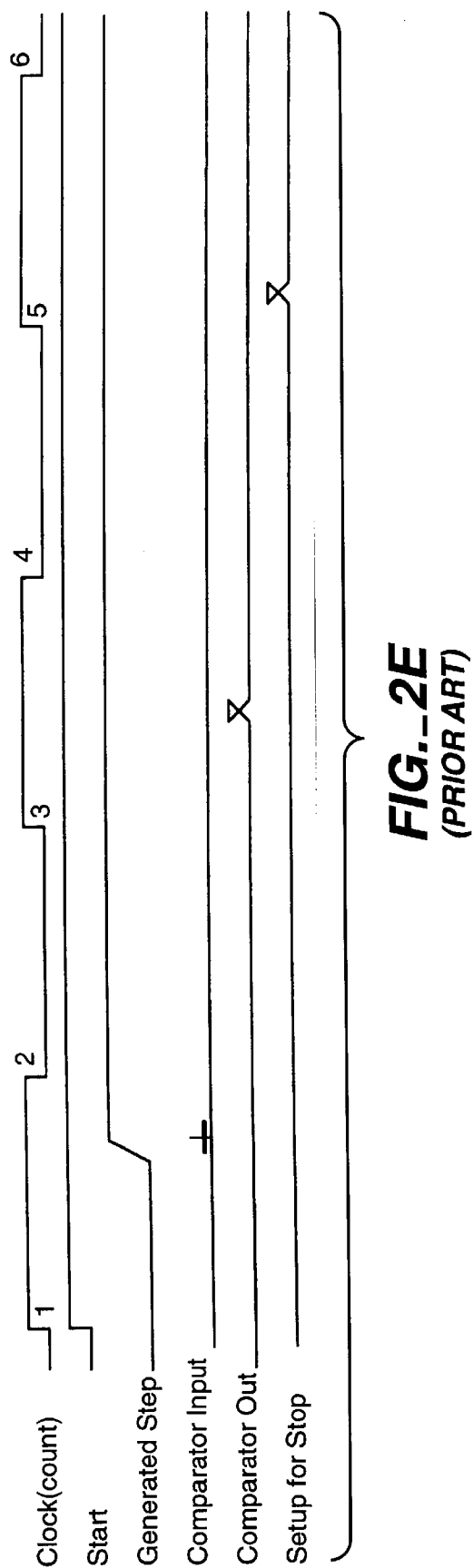
FIG._2E
(PRIOR ART)

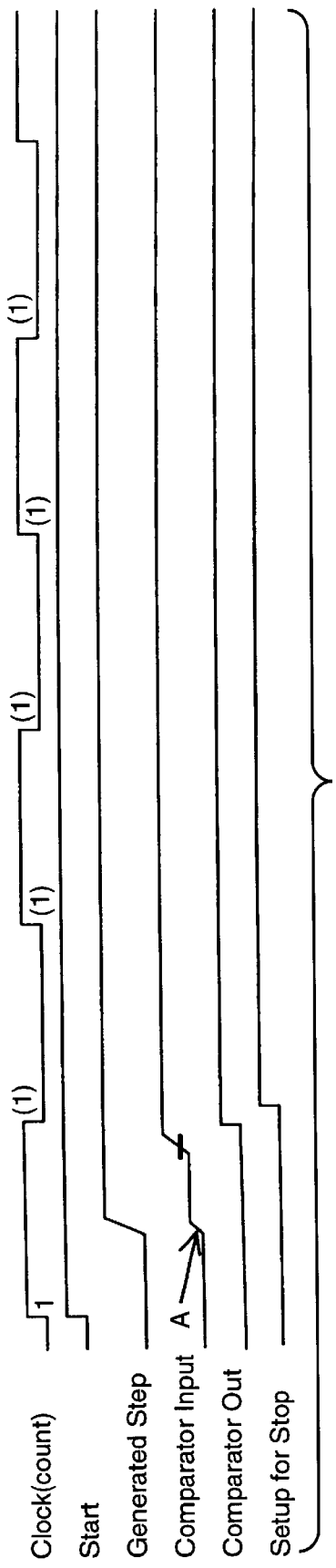
FIG._4A
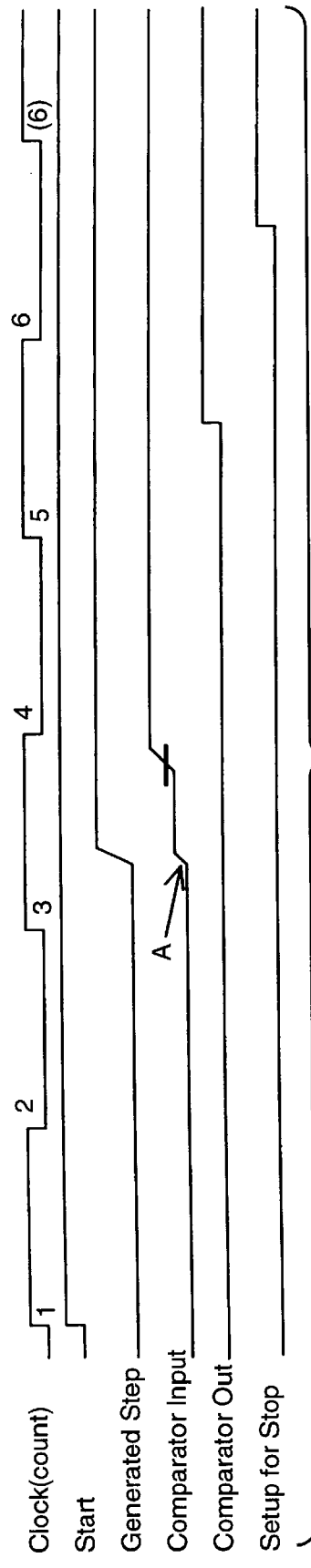
FIG._4B

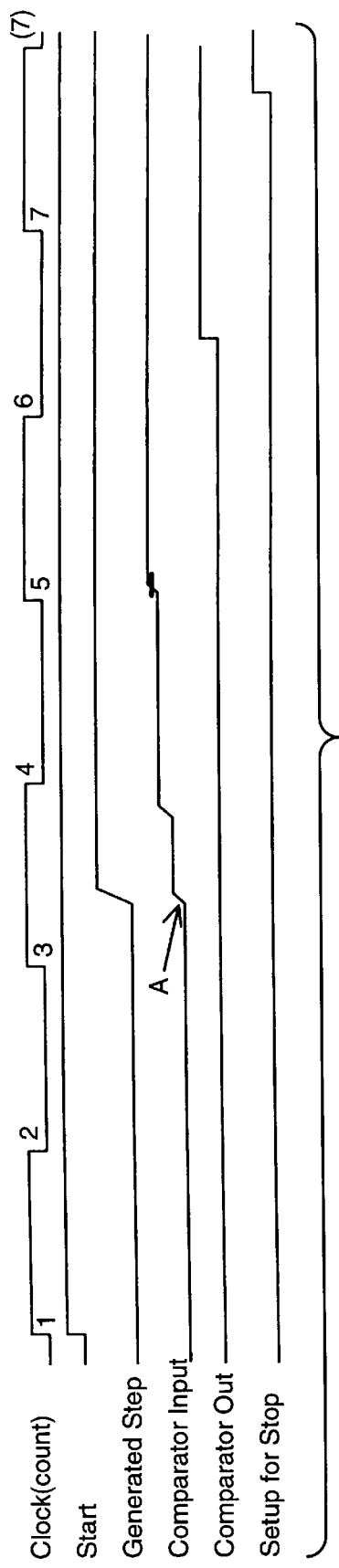
FIG._4C
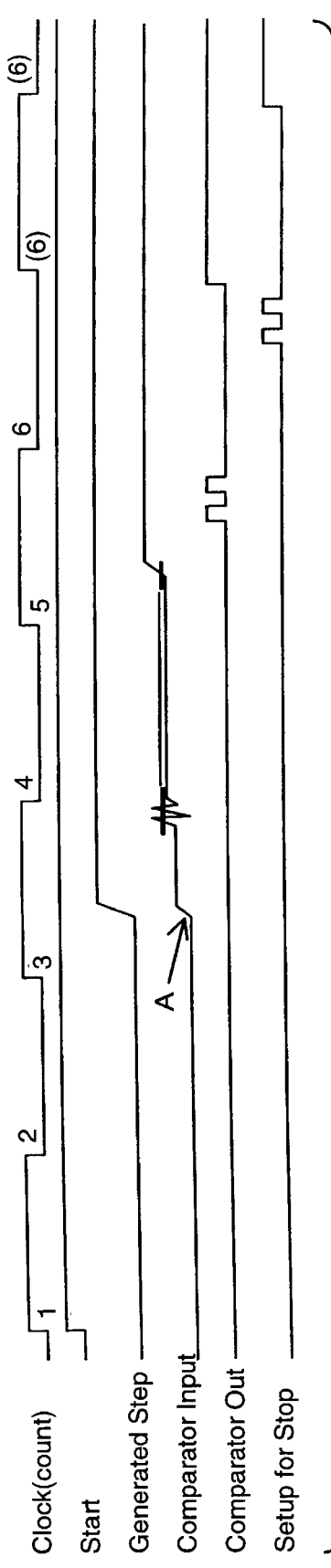
FIG._4D

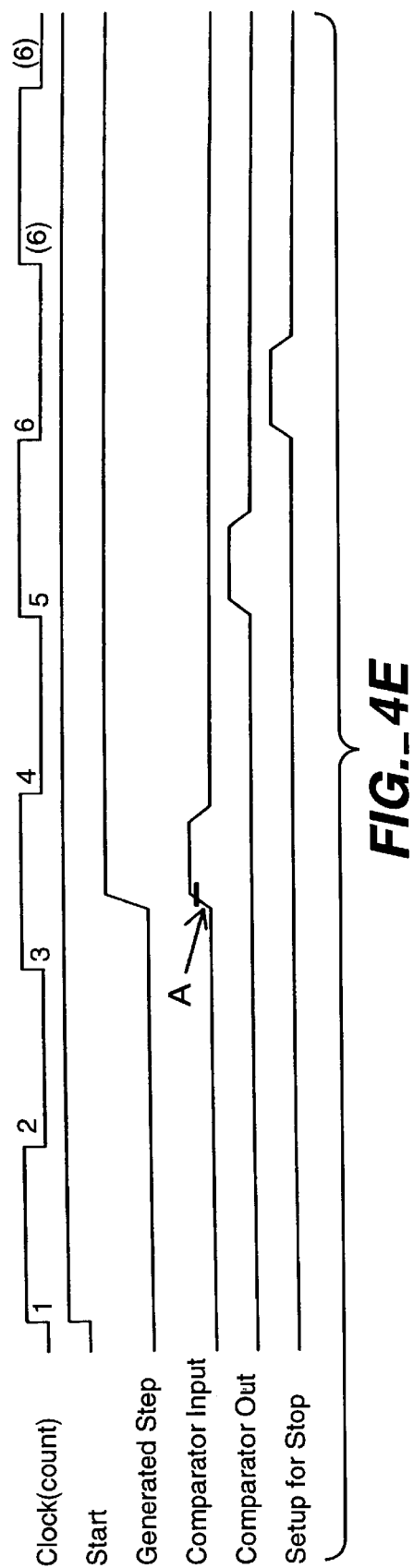
FIG._4E

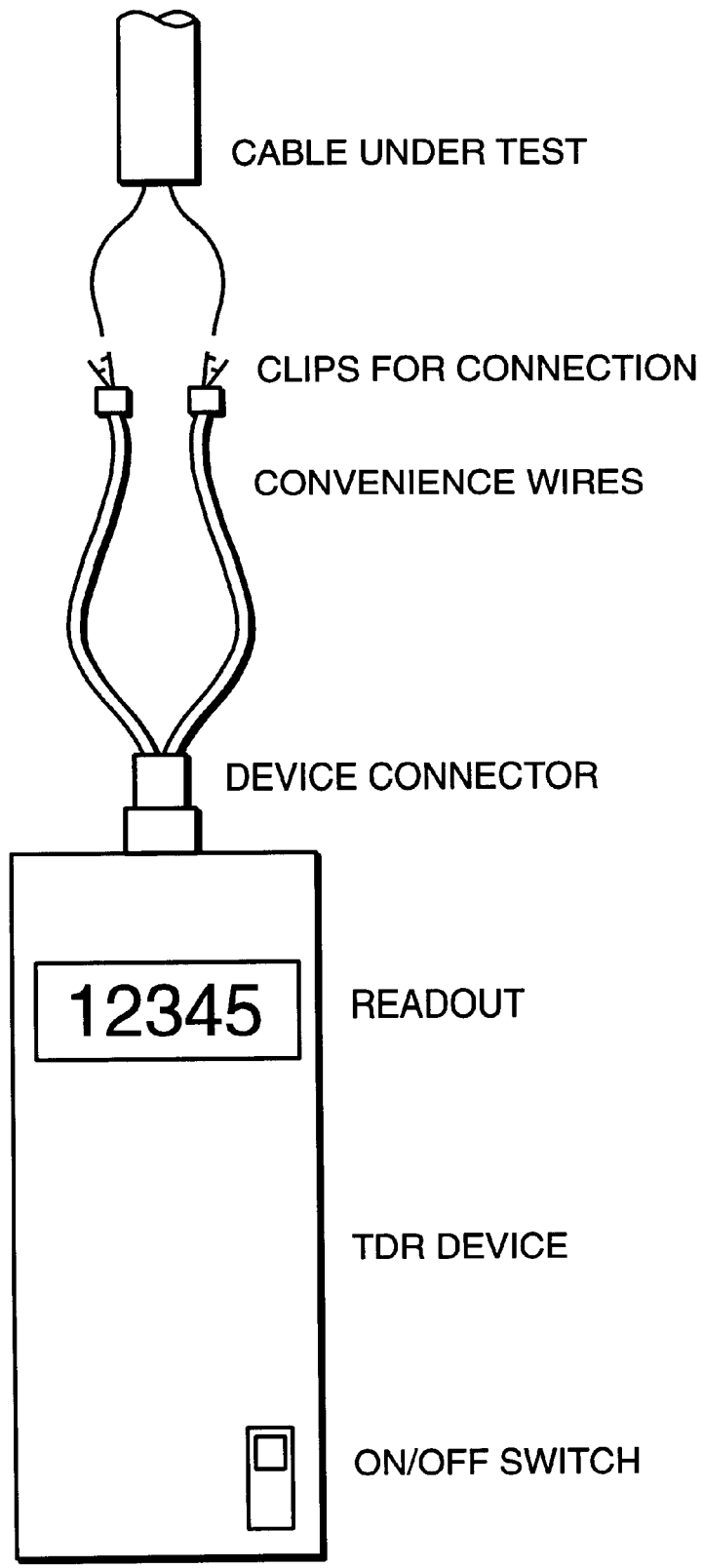
FIG._5

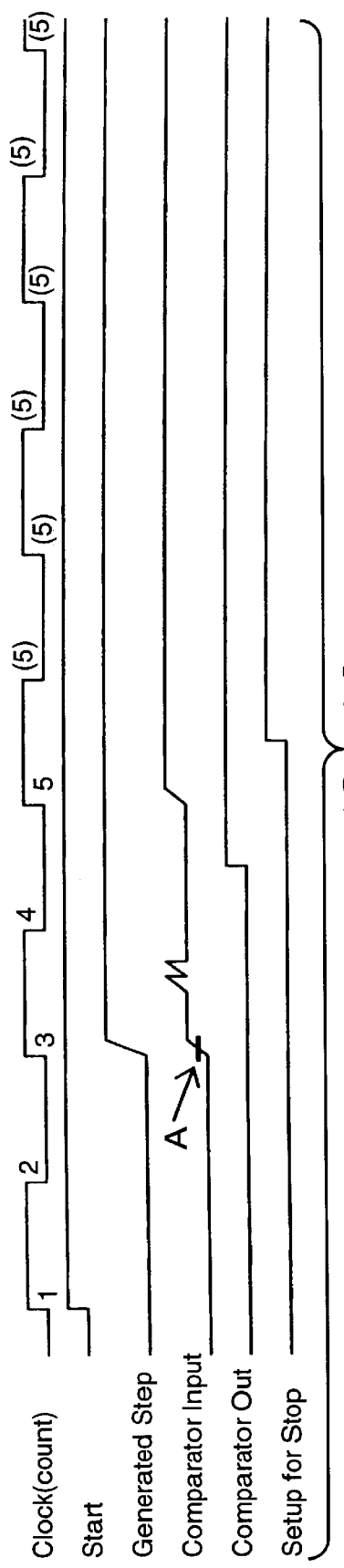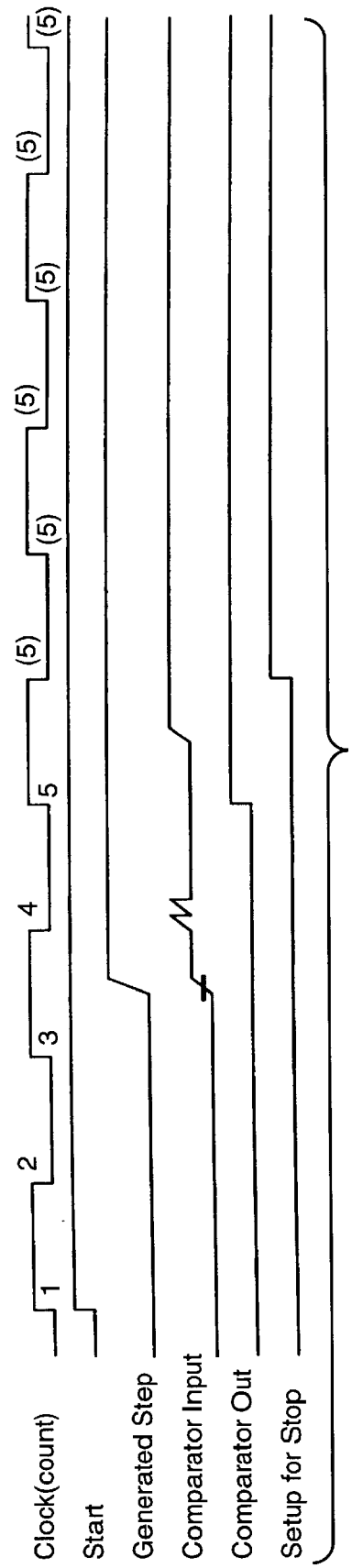

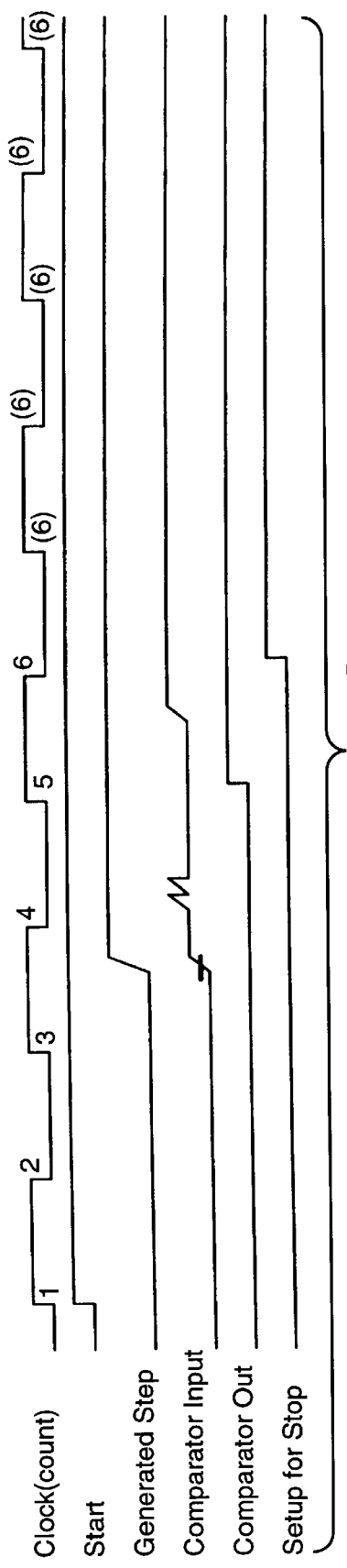
FIG._6C
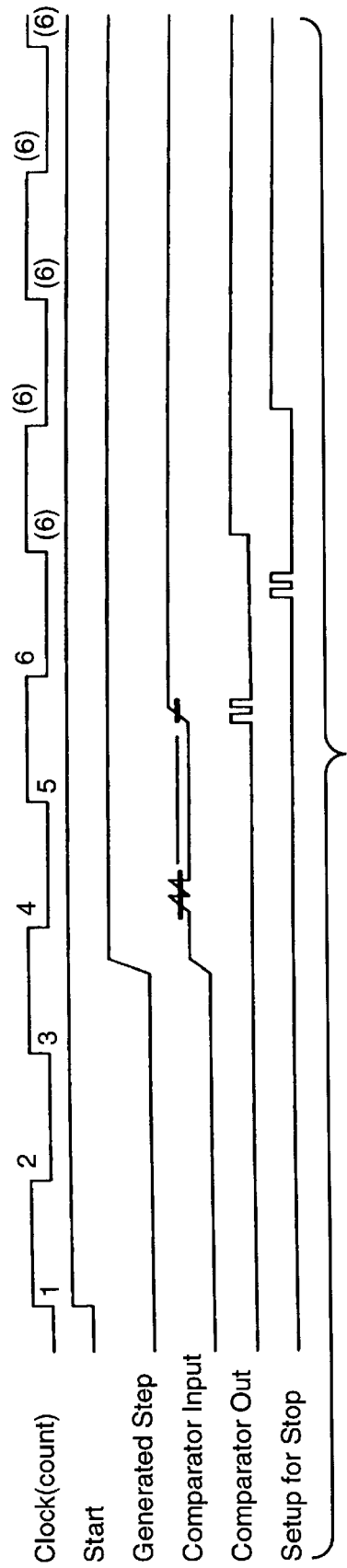
FIG._6D

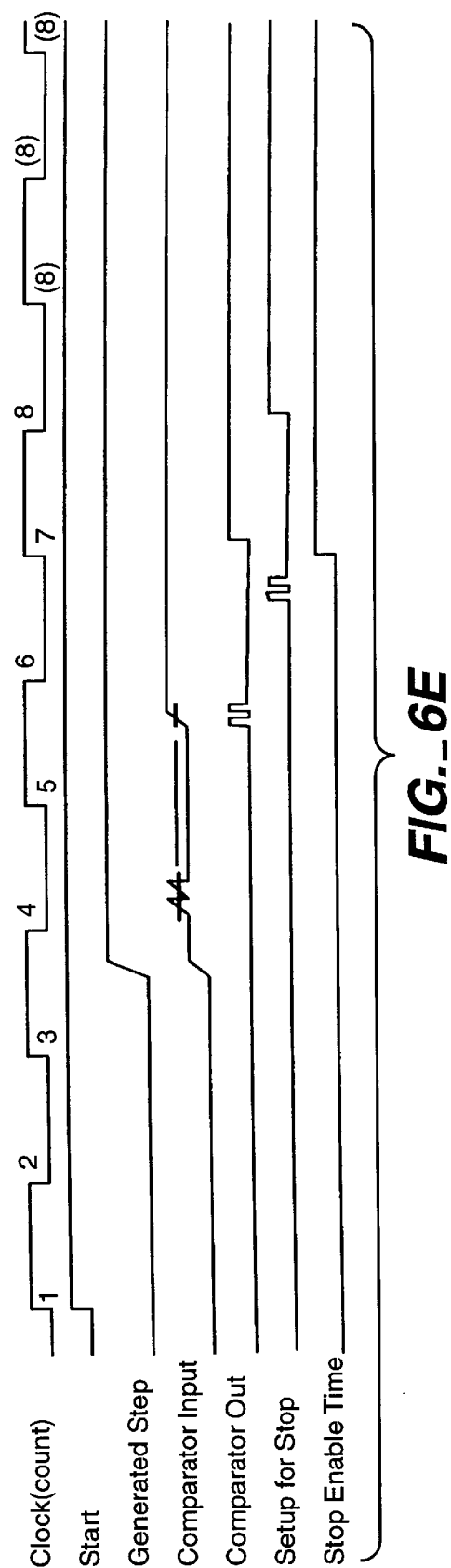
FIG._6E

TIME DOMAIN REFLECTOMETRY APPARATUS AND METHOD

TECHNICAL FIELD

This invention relates to a time domain reflectometry system for locating faults in a wire pair or cable. The system encompasses both an apparatus and a method.

BACKGROUND OF THE INVENTION

A time domain reflectometer (TDR) is a device that generates an initial electrical signal, couples that signal to a pair of conductors, and observes the electrical waveform at that coupling point. That observed waveform is comprised of an amount of the initial signal and an amount of each signal, if any, that is reflected back from any non-uniformity in the impedance of the conductor pair. The relative amplitudes of the initial signal and the reflected signals are dependent on the relative impedances at each of the signal origination points. The elapsed time (T) between the observation of the initial signal and the observation of the reflections is dependent on the physical distance (D) between those signal points and the velocity of propagation (VOP) for the conductor pair. This VOP is usually between ½ and 1 times the speed of light in a vacuum. Since the signal travels from the coupling point to the reflection point and then back, the elapsed time is equal to twice the physical distance divided by the velocity of propagation. T=2D/VOP. In this discussion, T (2D/VOP) is called the "electrical length." One of the common uses of the TDR technique is to determine the distance between the point of connection and a fault in a cable. The fault (shorted wires, broken wire, electrical leakage due to moisture, crushed dielectric, etc.) usually manifests itself as a non-uniformity in the impedance at the point of the fault and is thus observed as a reflected signal. The distance is calculated by the formula D=VOP×T/2.

While electrical TDR devices of various characteristics abound, a low-cost device with characteristics suitable for non-professional uses (minimal setup, clarity of readout, absence of special conditions) is not to be found. Methods for solving some of the inherent problems have been described in the literature, but they have not provided a comprehensive low-cost solution.

A first and basic problem is that the low-cost components available for the TDR measurement process have large inherent delays that accumulate to many times the desired resolution of the TDR measurement itself. Additionally, these delays tend to have a large ratio of minimum value to maximum value, and those values are dependent on temperature and power supply. For example, a distance resolution of 5 feet of normal coax cable would require a measurement resolution of 15 nanoseconds. The basic components of a typical low-cost TDR (pulse or step generator, comparator, logic circuit) will have 50 or more nanoseconds of delay, with a possible minimum of 5 nanoseconds. Such a low-cost measurement circuit would ordinarily exhibit a 15 foot distance uncertainty. Without any compensation mechanism, such a TDR could read a 5 foot cable as 20 feet long, or a direct short as a negative 15 feet. Using considerably higher cost components can bring the time uncertainty down to 15 ns from 45 ns, but that still represents an unacceptable 5 foot variance in reading. The various methods to nullify this non-determinate delay as described in the literature add significant cost or complexity to the circuit and have not lent themselves to inclusion in a low-cost TDR product.

A second and related problem is that the non-professional user will often connect the Cable-Under-Test to the TDR via a short set of "convenience wires" that may have impedance characteristics very different from the Cable-Under-Test. Ordinary TDR's require that the Cable-Under-Test be connected directly to the TDR connection point, since the presence of these convenience wires will appear to the TDR to be the first fault in the cable.

A third problem with many TDR systems is the inability thereof to make a valid measurement within a short distance (10–20 feet) of the initial electrical signal point. This distance is related to the internal timing mechanisms and is usually called the "dead zone." While there are methods that reduce or eliminate the dead zone, they are not low-cost.

Some existing TDR products do allow for the calibration of their internal delays and dead zone. Some use internal relays to isolate the test system from the external cable, or require that the user remove all external cables. This invention allows for the calibration of the internal delays with no user action and at a minimal component cost.

The following United States patents are cited as being representative of the prior art: U.S. Pat. No. 5,514,965, issued May 7, 1996; U.S. Pat. No. 5,440,528, issued Aug. 8, 1995; U.S. Pat. No. 5,382,910, issued Jan. 17, 1995; U.S. Pat. No. 4,970,466, issued Nov. 13, 1990; U.S. Pat. No. 4,538,103, issued Aug. 27, 1985; U.S. Pat. No. 4,739,276, issued Apr. 19, 1988; U.S. Pat. No. 5,461,318, issued Oct. 24, 1995.

None of these patents suggest the apparatus and method set forth herein.

DISCLOSURE OF INVENTION

This invention provides a method for placing a "reference length" in the TDR measurement path that will allow the calibration (nullification) of the inherent delays of low-cost hardware without significant additional cost. The presence of this reference length provides a "reference position" at the start of the reference length for the TDR measurement system. This reference length permanently resides in the measurement path, thus removing all the costs of switching a reference in and out, and eliminating the need for the user to do anything special prior to the calibration process. The system can thus perform calibration of its internal delays at any time without disturbing the user operation. In a battery-powered system where the power supply voltage may decrease significantly during operation, or in an environmental situation where the temperature may vary considerably, a scheduled or event-driven recalibration can be performed by the system without interfering with or without even notifying the user.

An additional object of this invention is to provide for an offset from the reference position in the TDR calibration. This offset removes the effects of the reference length and the measurement errors that can result from impedance variations at the point of connection of the Cable-Under-Test. This offset can be set large enough to also remove the effects of the "convenience wires" that may be present in the measurement path prior to the Connection Point to the Cable-Under-Test. In the preferred embodiment of this invention, the sum of the reference length and the length of the convenience wires is selected to be somewhat less than 1 unit of the internal reference clock, making the desired offset=1.

A typical calibration process using this invention would consist of the following steps:

1. Perform a TDR measurement starting at an internal time reference and measure the time from this internal time reference to the reference position. This is the reference time.

2. To this reference time, add an offset that is chosen to be somewhat larger than the sum of the reference length and the maximum allowed length of convenience wires. This total is the "stop enable time."

3. Adjust the TDR process to delay the enabling of the capture of any signals for this stop enable time while keeping the initial signal at the internal reference time, thus effectively "starting" its measurement at the end of the stop enable time.

Subsequent TDR measurements will now ignore the reference length and the convenience wires, measuring only the Cable-Under-Test.

Additionally, since both the start delay time and the dead zone start at the internal reference time, some if not all of the dead zone will be hidden by the stop enable time. In the preferred approach, the dead zone is also effectively eliminated.

The time domain reflectometry apparatus of the present invention is for testing a cable and includes electrical signal generator means.

Cable connector means is provided for connecting a cable to the apparatus.

Means defining a time domain reflectometer measurement path is incorporated in the apparatus for directing electrical signals generated by the electrical signal generator means to said cable connector means and for receiving reflected electrical signals from a cable attached to the cable connector means.

A reference length of conducting material is positioned in the time domain reflectometer measuring path between the electrical signal generating means and the cable connector means for calibrating the operation of the apparatus.

Other features, advantages, and objects of the present invention will become apparent with reference to the following description and accompanying drawings.

BRIEF DESCRIPTION OF DRAWINGS

FIG. 1A is a block diagram of a typical prior art low-cost TDR;

FIG. 1B is a tabular representation of typical delays inherent in the components of a typical low-cost TDR, such as that shown in FIG. 1A;

FIGS. 2A–2E illustrate voltage waveforms at selected locations of the circuit of FIG. 1 for Cable-Under-Test situations;

FIGS. 4A–4E illustrate voltage waveforms at selected locations of the circuit of FIG. 3A for Cable-Under-Test situations;

FIG. 5 is a frontal view of apparatus constructed in accordance with the teachings of the present invention with convenience wires and a Cable-Under-Test; and FIGS. 6A–6E illustrate voltage waveforms arising from the use of the variable delay device incorporated in the apparatus of the present invention.

BEST MODE FOR CARRYING OUT THE INVENTION

Figures 3A, 3B:
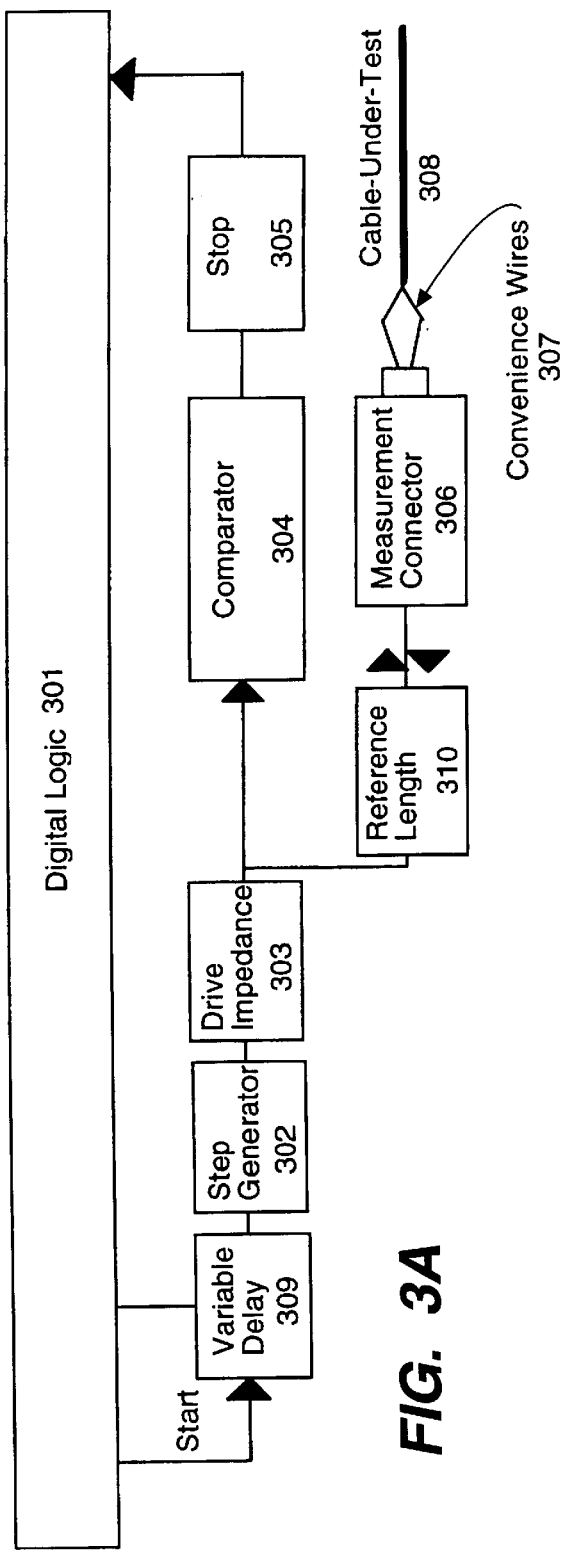
FIG. 3A is a block diagram of a TDR constructed in accordance with the teachings of the present invention.
FIG. 3B is a tabular representation of components employed in the apparatus of FIG. 3A and illustrating time delays associated therewith.

In the common prior art TDR shown in FIG. 1A, a pulse or a step is generated by an electrical signal generator 102 coupled via a drive impedance 103, to a measurement connector 106 and convenience wires 107 and a cable-under-test 108. Some systems use a pulse, others use a step, each having its own attributes and shortcomings. For this description, "step" will be used for illustrative purposes, although a pulse can be used just as effectively. The electrical step passes through the measurement path, consisting here of the measurement connector 106, the convenience wires 107, and the cable-under-test 108. Note that the convenience wires 107 could be absent, with the cable 108 to be tested being directly connected to the measurement connector 106. All parts of this measurement path, including the far end of the cable 108, will reflect some part of the step back through the measurement path.

The observed signal amplitude at the input to the comparator 104 is the time-relative summation of the voltages from the reflections at each of the elements in the path of the generated signal. These reflections will come from the measurement connector 106, the convenience wires 107, the cable 108, and the impedance at the end of the cable. The amplitude of each reflection is related to the impedance at the point of that reflection and the drive impedance 103.

The drive impedance 103 is constructed of a fixed resistive element and will maintain its impedance characteristics throughout the voltage and time considerations of this measurement. The measurement connector 106 is also fixed in construction and its characteristics will not change throughout this measurement. The convenience wires 107 and the cable 108, however, have impedance characteristics that are varied over their physical length, including any impedance that may be connected to the far end of the cable. Note that the convenience wires will have an impedance that varies significantly as the user physically moves and separates the individual wires. Also, as noted above, the convenience wires may not even be used, with the user connecting the Cable-Under-Test 108 directly to the measurement connector 106.

The comparator 104 is set to change its output when the input voltage passes a particular level (threshold) as indicated in the waveforms of FIGS. 2A–2E and 4A–4E by a short horizontal line on the comparator input waveform. This changed output is accepted by the stop logic 105 employed in the TDR.

The digital logic 101 of the TDR uses an internal clock to control its activities. At some particular clock count, it will start an internal counter and it will activate the step generator 102, which causes the step operation and reflections described above. When the digital logic 101 receives the stop signal from the stop logic, it will stop the internal counter. The count in the internal counter now represents the time between the start signal and the received stop signal, with the resolution of the time period of the internal clock. In a low-cost TDR, an acceptable measurement resolution would be 5 feet, and this would correspond to a time resolution of approximately 15 ns for common cables. Since both edges of the clock could easily be used in such a digital system, the 15 ns time resolution corresponds to a 33 MHz clock.

The waveforms of FIGS. 2A and 2B demonstrate the variance in reading due to the spread of minimum and maximum values of internal delays.

The waveform of FIG. 2A shows the relevant signals referenced to a 33 MHz clock, and the minimum delay times as tabulated in FIG. 1B. The waveform of FIG. 2B shows the same signals and clock with the maximum delay times as tabulated in FIG. 1B. One can see that the variance in counter value due to the spread of minimum and maximum delay times is 3 (4−1) and represents 15 feet for a common coax cable. Without any corrections performed, this would represent an unacceptable variance in readout to the user.

The waveforms of FIGS. 2C and 2D demonstrate how the presence of the convenience wires 107 causes the measurement to be invalid.

The waveform of FIG. 2C shows the relevant signals with a short (approximately 6 foot) piece of unterminated cable 108 attached. The internal delays are shown at their maximum for clarity in the drawing. The comparator 104 threshold is set at a voltage level corresponding to the reflection from the unterminated end of this short cable. In comparison to the waveform of FIG. 2B, the counter reaches value 5, 1 more than in the waveform shown in FIG. 2B, representing an additional 5 feet of cable added to the measurement path. This is a valid and reasonable measurement. The waveform of FIG. 2D shows the same signals as the waveform of FIG. 2C, with a short set of convenience wires 107 connected between the measurement connector 106 and the 6 foot piece of unterminated cable 108. Again, the internal delays are shown at their maximum for clarity in the drawing. The reflections due to the convenience wires cross the comparator threshold and thus stop the count at that point, ending the measurement prior to the receipt of the reflection from the end of the cable. This would be an incorrect measurement.

The waveform of FIG. 2E shows the difficulty in detecting a direct short at the measurement connector 106.

In the waveform of FIG. 2E the reflection caused by a direct short at the measurement connector 106 is shown as a thin vertical line representing its extremely small duration. An ordinary short at that location could easily be less than one inch in length, resulting in a thin pulse as narrow as ¼ ns. Depending on the edge rate of the initial signal, the thin pulse could have a maximum voltage lower than the inherent noise of the system. Low-cost hardware cannot hope to capture such a thin pulse. The comparator output and stop waveforms are identified by an X, indicating where their transitions should be, but no actual transition will occur. In this measurement, the counter will not be stopped and thus the measurement is invalid.

FIG. 3A shows the same common TDR system as FIG. 1A with the addition of a component of this invention, reference length 310. A variable delay generator 309 is also an added component.

Waveforms shown in FIGS. 4A and 4B illustrate the differential measurement results at minimum and maximum values of internal delays. Note that the presence of the variable delay generator 309 has increased the variance of reading from 45 ns to 67 ns.

The waveforms shown in FIGS. 4A–4E show the same signals as the waveforms of FIGS. 2A–2E but as modified due to the addition of reference length 310. The effect of reference length 310 is to insert a voltage level at the junction of the drive impedance 303 and the measurement connector 306. The amplitude of this voltage level is related to the impedance of the reference length 310 and the drive impedance 303. The comparator threshold level can be set at approximately ½ of this voltage level. The time of the start of this voltage level is fixed at the end of the drive impedance 303 and the length of this voltage level is fixed as the electrical length of the reference length 310. The time of the start of this voltage level is hereinafter called the "reference position" and is marked as point "A" in the waveforms. Note that the reference position A and the steady voltage level following position A are present in all situations shown in waveforms 4A–4E. Any connections to the output of the measurement connector 306, whether shorts, open cables, or otherwise, will only affect the waveforms at a point in time later than the end of the reference length 310. The electrical length of the reference length 310 is chosen large enough to be easily detected by low-cost electronics. Thus, the inclusion of the appropriately characterized (impedance and electrical length) reference length 310 provides an easily detectable reference position for the TDR measurement system.

The waveforms 6A–6E illustrate the effects of use of the variable delay generator in the TDR.

The waveform of FIG. 6A shows the same connections as the waveform of FIG. 4D with the internal delays set to nominal values. The variable delay generator is set to its minimum (0). The comparator threshold is set to the voltage level of point A. Note that the "setup for stop" signal is after clock edge #5 and before the next clock edge. The counter reading is stopped at 5. Then the delay due to the variable delay generator 309 is increased incrementally, and the counter is read by the system. The waveform of FIG. 6B shows the signals when the delay is increased to the point where the setup for stop signal is just prior to the clock edge after #5. The system will still read 5 in the counter. At the next increment of the delay generator, the setup for stop signal is now just past the clock edge after #5. This is shown in the waveform of FIG. 6C. The system will now read a 6 when it reads the counter. When the system sees this change in counter reading, it will stop incrementing the variable delay. The system now "knows" the position of the start of the reference length to be at clock edge #6.

If the comparator threshold is now set to the correct level for a cable to be measured, the waveform shown in FIG. 6D demonstrates that both the cable edge and the noise due to the convenience wires are detected by the comparator. The output of the comparator that is due to the noise at the convenience wires will stop the counter and cause the system to have an incorrect reading. This is the same situation as depicted in the waveform of FIG. 2D. To avoid this failure, the system adds an offset to the "known" start of the reference length that is somewhat larger than the sum of the reference length and the convenience wires. In this preferred embodiment, that offset is 1. This total of 7 (6+1) is used as a delay to enable the capture of the stop signal and is called the "stop enable time." The system now ignores any "setup for stop" signal until after the stop enable time has been reached.

The waveform of FIG. 6E shows that this masks the noise signals due to the convenience wires and allows the system to make the correct measurement of the end of the cable (count=8).

What is claimed is:

1. A method of establishing a reference position in the measurement path of a time domain reflectometer comprising the steps of:

inserting a reference length of electrically conductive material in said measurement path where said reference length has a predetermined electrical length and impedance;

using the measurement of said reference length to establish a reference position within said measurement path, calibrating the operation of the time domain reflectometer utilizing said reference position, providing an additional offset from the reference position to prevent said reference length from influencing subsequent measurements made by said time domain reflectometer.

2. The method according to claim 1 wherein said offset is large enough to prevent said reference length and any additional time domain reflectometer components in the measurement path from influencing subsequent measurements made by said time domain reflectometer.

3. A method of calibrating a time domain reflectometer comprising the steps of:

performing a time domain reflectometer measurement starting at an internal time reference;

measuring the time from said internal time reference to a reference position to establish a reference time;

add an offset to the reference time, said offset being larger than the sum of a reference length incorporated in the time domain reflectometer and a predetermined convenience wire length to be employed with the time domain reflectometer to establish a stop enable time; and adjust the time domain reflectometer to delay the enabling of the capture of any signals during the established stop enable time while keeping the initial signal of the time domain reflectometer at the internal reference time, effectively starting measurement by the time domain reflectometer at the end of said stop enable time.

4. Time domain reflectometry apparatus for testing a cable, said apparatus including:

electrical signal generator means;

cable connector means for connecting a cable to said apparatus;

means defining a time domain reflectometer measurement path for directing electrical signals generated by said electrical signal generator means to said cable connector means and for receiving reflected electrical signals from a cable attached to said cable connector means; and a reference length of electrically conductive material permanently positioned in said time domain reflectometer measuring path between said electrical signal generating means and said cable connector means for calibrating the operation of the time domain reflectometry apparatus.

5. The time domain reflectometry apparatus according to claim 4 additionally including adjustment means for adjusting operation of the time domain reflectometry apparatus to compensate for the presence of said reference length of electrically conductive material in said time domain reflectometer measuring path and to prevent said reference length of electrically conductive material from influencing the testing of a cable attached to said cable connector means by the time domain reflectometry apparatus.

6. The time domain reflectometry apparatus according to claim 5 wherein said adjustment means comprises a variable delay generator.

7. The time domain reflectometry apparatus according to claim 4 wherein the impedance and electrical length of said reference length of electrically conductive material are of predetermined value.

8. The time domain reflectometry apparatus according to claim 4 wherein said cable connector means includes convenience wires, said adjustment means compensating for the presence of said convenience wires and preventing said convenience wires from influencing the testing of a cable attached to said cable connector means by the time domain reflectometry apparatus.

9. A method of testing a cable with a time domain reflectometer comprising the steps of:

generating an electrical signal;

conveying said electrical signal along a time domain reflectometer measurement path to a cable under test;

while conveying said electrical signal along said time domain reflectometer measurement path, passing said electrical signal through a reference length of electrically conductive material positioned in said time domain reflectometer measurement path to establish a reference position for time domain reflectometer measurement;

reflecting said electrical signal from said cable back through said time domain reflectometer measurement path and through said reference length of electrically conductive material; and comparing the generated electrical signal with the electrical signal reflected from said cable after passage thereof through the reference length of electrically conductive material.

10. The method according to claim 9 including the step of calibrating the time domain reflectometer utilizing the established reference position.

11. The method according to claim 9 wherein the reference length of electrically conductive material has a predetermined electrical length and impedance.

12. The method according to claim 10 comprising the additional step of providing an offset from the reference position during the step of calibrating the time domain reflectometer to prevent the reference length of electrically conductive material from influencing the testing of said cable by said time domain reflectometer.

13. The method according to claim 12 wherein said offset is of sufficient magnitude to prevent the reference length of electrically conductive material and all time domain reflectometer components between said cable and the location where the electrical signal is generated from influencing the testing of said cable by said time domain reflectometer.

* * * * *